(12) United States Patent
Dearth

(10) Patent No.: US 8,495,440 B2
(45) Date of Patent: Jul. 23, 2013

(54) FULLY PROGRAMMABLE PARALLEL PRBS GENERATOR

(75) Inventor: Glenn A. Dearth, Groton, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 148 days.

(21) Appl. No.: 13/221,543

(22) Filed: Aug. 30, 2011

(65) Prior Publication Data

US 2013/0055039 A1    Feb. 28, 2013

(51) Int. Cl.
 *G11C 29/00*        (2006.01)
(52) U.S. Cl.
 USPC .......................................... 714/720; 714/739
(58) Field of Classification Search
 USPC ............. 375/221; 706/12; 708/491; 711/167; 714/700, 707, 718, 720, 739
 See application file for complete search history.

(56) References Cited

U.S. PATENT DOCUMENTS

| | | | |
|---|---|---|---|
| 7,370,170 B2 * | 5/2008 | Shaikh et al. .................. | 711/167 |
| 7,480,197 B2 | 1/2009 | Carnevale et al. | |
| 7,492,807 B1 | 2/2009 | Buchmann et al. | |
| 8,037,375 B2 * | 10/2011 | Schaefer ........................ | 714/707 |
| 8,161,331 B2 * | 4/2012 | Bae et al. ....................... | 714/700 |
| 8,228,972 B2 * | 7/2012 | Tonietto et al. ................ | 375/221 |
| 2004/0024803 A1 * | 2/2004 | Montijo ......................... | 708/494 |
| 2005/0162882 A1 | 7/2005 | Reeves et al. | |
| 2007/0208819 A1 | 9/2007 | Talbot et al. | |
| 2009/0244997 A1 | 10/2009 | Searles et al. | |
| 2010/0188919 A1 | 7/2010 | Fox et al. | |
| 2010/0332921 A1 | 12/2010 | Schaefer | |
| 2011/0078370 A1 | 3/2011 | Chaudhuri et al. | |
| 2011/0218949 A1 * | 9/2011 | Cho et al. ....................... | 706/12 |

OTHER PUBLICATIONS

Advanced Micro Devices, BIOS and Kernel Developers Guide (BKDG) for AMD Family 11h Processors, 41256 Rev. 3.00, Jul. 7, 2008.
D. Riccardi et al., Xilinx, An Attribute-Programmable PRBS Generator and Checker, XAPP884, v1.0, Jan. 10, 2011.

* cited by examiner

*Primary Examiner* — David Ton
(74) *Attorney, Agent, or Firm* — Terrile, Cannatti, Chambers & Holland, LLP; Michael Rocco Cannatti

(57) ABSTRACT

A pseudo random bit stream generator is disclosed which has a fully programmable pseudo random polynomial up to the supported width of the CSRs, fully programmable tap selection for providing any specified combination of generator state taps, and fully programmable parallel sequence generation which determines the number of sequential bits calculated and how much the sequence generator advances per clock.

29 Claims, 4 Drawing Sheets

FULLY PROGRAMMABLE PARALLEL PRBS GENERATOR

BACKGROUND OF THE INVENTION

1. Field of the Invention

The present invention relates in general to the design and use of computer system memory. In one aspect, the present invention relates to pseudo random bit stream generators and methods for operating same.

2. Description of the Related Art

Whether integrated as discrete components or in System-on-a-Chip (SoC) applications, memory subsystems (such as double data rate (DDR) synchronous dynamic random access memory (SDRAM)) require precise timing and testing to ensure proper operation, especially as processor and DRAM speeds increase. For example, topological, electrical, thermal, power consumption and/or other environmental factors affecting the delivery of memory data/signals may require adjustment of local sampling clocks to sample in the middle of the received data eye. To make such adjustments, the memory controllers may be trained under BIOS control by sending data patterns from the controller to DRAM and looking for edges in data transitions to identify a "data eye" region where sampling decisions can be made so as to reduce the probability of sampling the incorrect state of the data. Even so, for channels with significant high frequency loss or reflections, data eye closure can arise from the effect of inter-symbol interference (ISI) which becomes more significant as data rates increase. However, as memory speeds increase, BIOS controlled training programs have increased difficulty generating, checking and controlling the training pattern sequences needed to achieve optimal data eye positioning. While hardware training mechanisms placed close to the DDR physical layer can provide good control precision, such solutions typically use a fixed function linear feedback shift register (LFSR) circuits to generate random data patterns. Such hardware circuits have limited flexibility and require significant circuit area, especially as the number of PRBS generator circuits increases with the number of DRAM data lanes.

Accordingly, a need exists for an improved system architecture, design, and method of operation for generating pseudo random data patterns which address various problems in the art that have been discovered by the above-named inventors where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

SUMMARY OF EMBODIMENTS

Broadly speaking, the present disclosure describes a programmable parallel pseudo random bit stream (PRBS) generator which supports full programmability of the pseudo random polynomial, full programmability of tap selection, and full programmability of parallel sequence generation. Selected embodiments of the programmable PRBS generator are described with reference to DRAM training applications where the PRBS generator can generate one or more pseudo random training patterns having different training rates, active training time spans and active lanes during various stages. However, it will be appreciated that the programmable PRBS generator may also be used in other applications, such as training over any type of clock-forwarding link, data scrambling and/or descrambling, physical system modeling, cryptographic applications, and the like. The disclosed PRBS generator includes a programmable state-bits generator circuit block and a plurality of programmable tap selection circuit blocks. The programmable state-bits generator circuit block supports full programmability of the pseudo random polynomial by providing a plurality of n state-bit control status registers as control inputs to mask the n PRBS logic trees which generate the PRBS next state-bits from the PRBS current state-bits. The disclosed PRBS generator also supports full programmability of the tap selection by providing a plurality of k tap selection circuits which each include a plurality of m per tap, per delay control status registers as control inputs to mask the PRBS state-bits applied to the m logic trees at each tap selection circuit. By connecting the output of the PRBS state-bits generator circuit block to the plurality of k tap selection circuits, the disclosed PRBS generator may be configured to support full programmability of the parallel sequence generation.

In selected example embodiments, a method and apparatus are provided for generating a pseudo random bit stream. In the disclosed methodology, control bits are programmed into register elements (e.g., control status registers) which include one or more PRBS state bit register elements and one or more per tap state bit register elements. The control bits in each PRBS state bit register element enable state feedback terms to generate the next state bit of the generator, and the control bits in each per tap state bit register element masks a combinatorial logic element in a tap selection hardware circuit. With the register elements programmed, a plurality of output latches is clocked to capture outputs from the combinatorial logic elements in the state bits generator circuit and the tap selection hardware circuit. In this way, the outputs from the output latches in the state bits generator circuit are provided to the tap selection hardware circuit and fed back as inputs to the combinatorial logic elements in the state bits generator circuit, and the outputs from the output latches in the tap selection hardware circuit are output as a pseudo random bit stream sequence. In selected embodiments, the register elements are programmed by loading n control bits into a plurality of n PRBS state bit control status registers in the state bits generator hardware circuit, so that each of the n PRBS state bit control status registers masks an AND-XOR logic tree in the state bits generator hardware circuit to programmatically control a characteristic polynomial of the state bits generator hardware circuit. With the PRBS state bit control status registers loaded, the latches may be clocked by clocking a plurality of n flip-flops, each of which is connected to an AND-XOR logic tree in the state bits generator hardware circuit. In other embodiments, the register elements are programmed by loading n control bits into a plurality of m per tap state bit control status registers in the tap selection hardware circuit, so that each of the m per tap state bit control status registers masks an AND-XOR logic tree in the tap selection hardware circuit to programmatically control tap selection and sequence delay values of the tap selection hardware circuit. With the per tap state bit control status registers loaded, the latches may be clocked by clocking a plurality of m flip-flops, each of which is connected to an AND-XOR logic tree in the tap selection hardware circuit. With this arrangement, the control bits for the register elements may be computed in software to specify a specific characteristic polynomial for the pseudo random bit stream sequence, to specify how far the pseudo random bit stream sequence advances each clock cycle, and/or to specify which outputs from output latches will be applied as inputs to the combinatorial logic elements in the state bits generator hardware circuit. In addition, the pseudo random bit stream sequence may be used to perform a training procedure to initialize a link between a memory controller and a memory device by transmitting the pseudo random bit stream sequence data over the link from the memory controller to the memory device where it is received as a training pattern sequence; comparing the training pattern sequence with an expected result to identify data eye positioning for the link.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
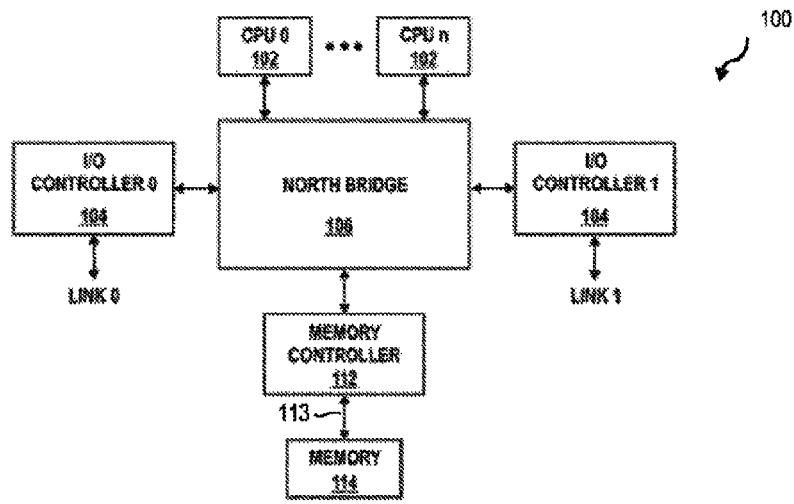
FIG. 1 shows a simplified circuit block diagram of an example processor system that may be configured according to various embodiments of the present disclosure.

A fully programmable parallel pseudo random bit stream (PRBS) generator circuit and method of operation are described in which the generator polynomial, tap selection and parallelism level are programmable attributes, thereby providing flexible pseudo random pattern generation mechanisms for generating a one or more different pseudo random bit sequences in parallel. In selected embodiments, the programmable PRBS generator is constructed with a simple hardware structure in which control status registers (CSRs) are programmed to mask the operations of logic tree circuits which generate state bits. In a state-bits generator circuit block, the CSR hardware structure is deployed to control a state feedback configuration where a plurality of state-bit control status registers mask a corresponding plurality of PRBS logic trees which each process n PRBS current state-bits to generate a single next state-bit. At the next clock cycle, the next state-bits are output as n state bits from the state-bits generator circuit block and fed back as inputs to the PRBS logic trees in the state-bits generator circuit block. The CSR hardware structure is also deployed in a plurality of k tap selection circuit blocks for each lane, where each tap selection circuit block includes a plurality of m tap selection control status registers which mask a corresponding plurality of m PRBS logic trees which each process n PRBS state-bits to generate a single next state-bit. Each k tap selection block drives a single serial lane. The purpose of having m tap outputs is to generate bits in advance because the generator and tap selection blocks could be running slower than the serial bit stream interface to memory. At the next clock cycle, the next state-bits are output as m state bits from the selected tap selection circuit block. With this approach, the complexity of creating specific PRBS polynomials and tap selection is removed from the generator hardware which would be hard-coded in silicon and pushed to software which loads the control status registers with programmed values. In addition, a plurality of different pseudo random bit sequences (which are time delayed sequences from the base sequence) can be generated in parallel by separately programming the k tap selection circuit blocks. The parallel generation of different sequences can be usefully applied to generate alternate pseudo random training patterns for adjacent channels or lanes, thereby increasing signal ISI which effectively reduces the data eye width so as to achieve more accurate data eye positioning for each lane. In addition, the programmable PRBS generation enables different training data rates, different random pattern periodicity, and different active lanes to be tested and easily steer specific patterns to different lanes with a single programmable PRBS generator.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. Some portions of the detailed descriptions provided herein are presented in terms of algorithms and instructions that operate on data that is stored in a computer memory. Such descriptions and representations are used by those skilled in the art to describe and convey the substance of their work to others skilled in the art. In general, an algorithm refers to a self-consistent sequence of steps leading to a desired result, where a "step" refers to a manipulation of physical quantities which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities. Unless specifically stated otherwise as apparent from the following discussion, it is appreciated that, throughout the description, discussions using terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Referring now to FIG. 1, there is shown a simplified block diagram of an example processor system 100 that may be configured according to various embodiments of the present disclosure. As depicted, the system 100 includes one or more central processing units (CPUs) or processing cores 102, one or more input/output (I/O) controllers 104, a Northbridge 106, a memory controller 112, and a memory 114, which includes an application-appropriate amount of dynamic random access memory (DRAM). The system 100 may also include I/O devices (not shown) coupled to the I/O controllers 104. The I/O devices may be, for example, a hard-drive, I/O port, network device, keyboard, mouse, graphics card, etc. In selected embodiments, the memory 114 is a shared system resource that is coupled to the memory controller 112. The memory controller 112 may broadly be considered a resource scheduler. While only two of the CPUs 102 are depicted in the system 100, it will be appreciated that the techniques disclosed herein are broadly applicable to processor systems that include additional or fewer CPUs, each of which may have one or more levels of internal cache. Similarly, while only two I/O controllers 104 are depicted in the system 100, it will be appreciated that the techniques disclosed herein are broadly applicable to processor systems that include any number of I/O controllers.

The memory controller 112 may be, for example, a dynamic random access memory (DRAM) controller, in which case the memory 114 includes multiple DRAM modules. The memory controller 112 may be integrated within the Northbridge 106 or may be located in a different functional block of the processor system 100. The I/O controller(s) 104 may take various forms. For example, the I/O controllers 104 may be HyperTransport controllers. In general, the system 100 includes various devices that read/write information from/to the memory 114. In a typical implementation, the memory 114 is partitioned into a number of different rank/bank pairs, where the rank corresponds to a chip select. For example, a DRAM channel may have four ranks per channel with eight banks per rank, which corresponds to thirty-two independent information states that need to be tracked to choose an incoming request schedule that provides an optimal performance. In selected embodiments, the system 100 may implement more than one DRAM channel and the memory controller 112 may be configured to track less than the maximum number of independent information states.

When CPU 102 performs a write cycle to memory 114, it provides address, control, and data signals to DRAM controller 112. DRAM controller 112 receives the request from CPU 102, and performs a write operation with memory 114 via interface 113. The memory write operation results in the memory location, indicated by the specified address, being updated with the data value supplied by CPU 102. In addition, a command signal informs memory 114 that a write operation is to be performed. A memory data strobe signal DQS identifies to memory 114 when data DQ is ready to be written into the memory.

When CPU 102 performs a read cycle to memory 114, it provides address and control signals to DRAM controller 112. DRAM controller 112 receives the request from CPU 102, and performs a read operation with memory 113 via interface 113. The command signal informs memory 114 that a read operation is to be performed. The read operation accesses memory 114 at the specified address and memory 114 responds by providing DRAM controller 112 with the requested data DQ and also provides memory data strobe signal DQS which informs DRAM controller 112 that the requested data is available. After completing the read operation, DRAM controller 112 provides the requested data to CPU 102.

As depicted, the memory 114 may be implemented with double data rate (DDR) memory. In addition, the DRAM controller 112 may support DDR2, DDR3, or GDDR5 (Graphics Double Data Rate, version 5) memory, but may also support other versions of the DDR standard and other forms of DRAM. Moreover, DRAM controller 112 may also be modified to support other types of memory such as DDR static random access memory (SRAM), DDR flash memory, and the like. With DDR memory 114, a memory data strobe signal DQS transmitted during a read cycle is nominally aligned with transitions of data signal DQ. Likewise, during a write cycle, DRAM controller 112 transmits memory data strobe signal DQS that is nominally centered on the transitions of data signal DQ. Despite the nominal timing requirements, the physical distance between memory 114 and processor 102 and other environmental factors can cause delays in the DQS and/or DQ signals. To account for such delays, the DRAM controller 112 may be configured to perform a calibration procedure after power is initially supplied to data processing system 100 and reset is performed in order to determine the appropriate delay values that can be stored as delay values in registers that control a time delay values provided by corresponding delay circuits. Though implemented in hardware, the calibration scheme may be controlled by the CPU 102 which receives instructions and data from BIOS memory (not shown) to facilitate initialization of data processing system 100, including instructions that implement time delay training algorithms to help establish communication protocols between DRAM controller 112 and memory 114. Such training algorithms may perform data eye measurements by generating a training sequence for each bit stream that is then evaluated at the receiver to identify the data eye for that bit.

Figure 2:
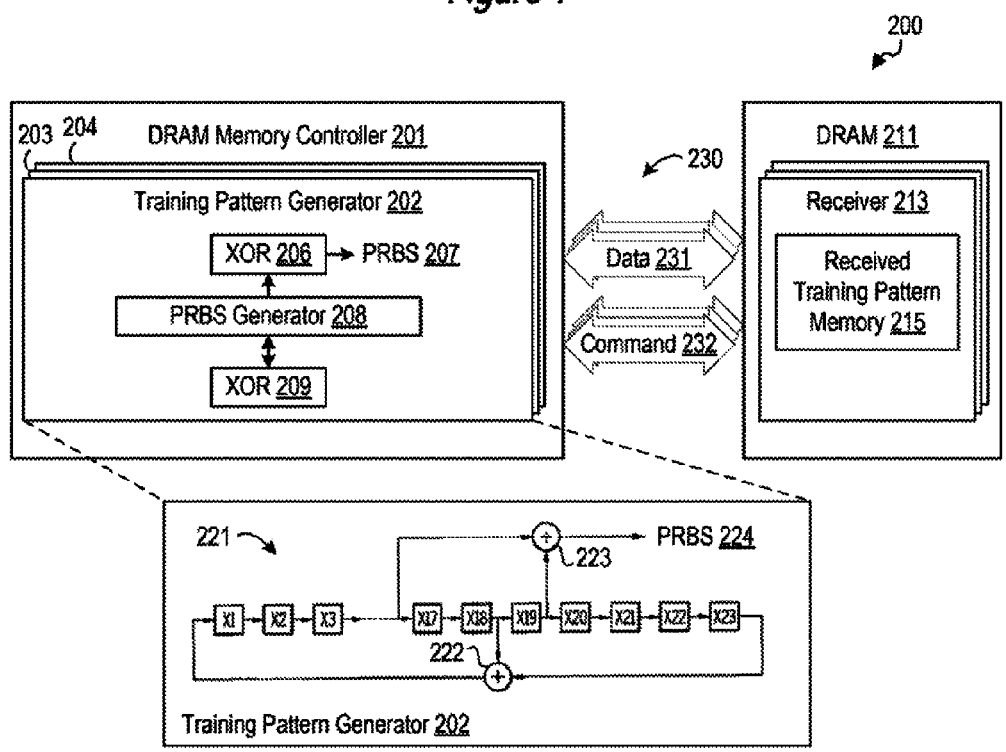
FIG. 2 shows a simplified block diagram of an example memory system in which a memory controller uses pseudo random bit stream generators to generate training patterns for training data signals over one or more channels.

To provide an example of such a calibration scheme, reference is now made to FIG. 2 which shows a simplified block diagram of an example memory system 200 in which a memory controller 201 and/or memory device 211 uses pseudo random bit stream generators to generate training patterns for training data signals over one or more channels 230 as data 231 and command 232 signals. At the memory controller 201, a training pattern generator 202 uses a PRBS generator 208 with combinatorial logic blocks 206, 209 to generate the pseudo random bit stream 207 that is transmitted by the transmitter or controller 201 as a memory write operation. At the receiver or DRAM 211, the training patterns are detected at the receiver 213 and stored in memory 215 for use in calibrating or training the memory controller 201 and/or DRAM 211 to look for edges in data transitions to identify a "data eye" when sampling decisions can be made for reads and writes. The calibration processing can be performed at the DRAM 211 or at the memory controller 201 which retrieves the received training pattern from memory 215 in the DRAM 211.

Typically, a training pattern generator 202 uses as a linear feedback shift register (LFSR) 221 having a fixed feedback configuration of predetermined bits from the PRBS shift register (which are referred to as "feedback taps"). As the bits shift within the register, the feedback taps are the PRBS state elements that affect the next state. This feedback configuration can be modeled mathematically as a linear system with a specific characteristic polynomial. In the depicted example, the training pattern generator 202 is a 23-bit LFSR 221 having feedback taps at the 23rd and 18th bits and output taps at the 16th and 19th taps. Tap 23 is XORed with tap 18 by XOR gate 222, and the result is fed back to the input and as a PRBS output 223. The resulting LFSR characteristic polynomial is $x^{23}+x^{18}+1$. In addition, tap 16 is XORed with tap 19 by XOR gate 223, and the result is output as PRBS 224. Because the system is linear, the data sequence seen at PRBS 224 is a time delayed version of the sequence seen at LFSR 221 Tap X23. In operation, the LFSR 221 is initialized with an initial seed value and then clocked to produce a sequence of internal states that repeat. The sequence of values produced is completely determined by its current (or previous) state and the LFSR characteristic polynomial. Certain characteristic polynomials ensure that the sequence is maximal length meaning the pattern repeats after a sequence length of $2^n-1$ where n is the number of state elements in the LFSR. Given enough state bits in the LFSR, the feedback function can be constructed to produce a very long bit sequences which would appear random.

In parallel-lane configurations (such as where a memory controller 201 which connects over a bus 230 to external DRAM memory 211), each lane typically has its own training pattern generator, as indicated by the plurality of training pattern generators 202-204 provided in the memory controller 201 for each lane or data channel. While using different PRBS sequences for each lane creates more pattern diversity, forming all these PRBS generators requires a substantial amount of circuit area. On the other hand, using a single shared PRBS generator for all lanes reduces the required circuit area, but increases the risk of not achieving optimum data eye placement because crosstalk and ISI effects are more constrained. The optimal lane eye position is not only sensitive to the pseudo random training pattern used on the targeted lane, but also to the pseudo random training patterns used on adjacent lanes (crosstalk dependence).

Figure 3:
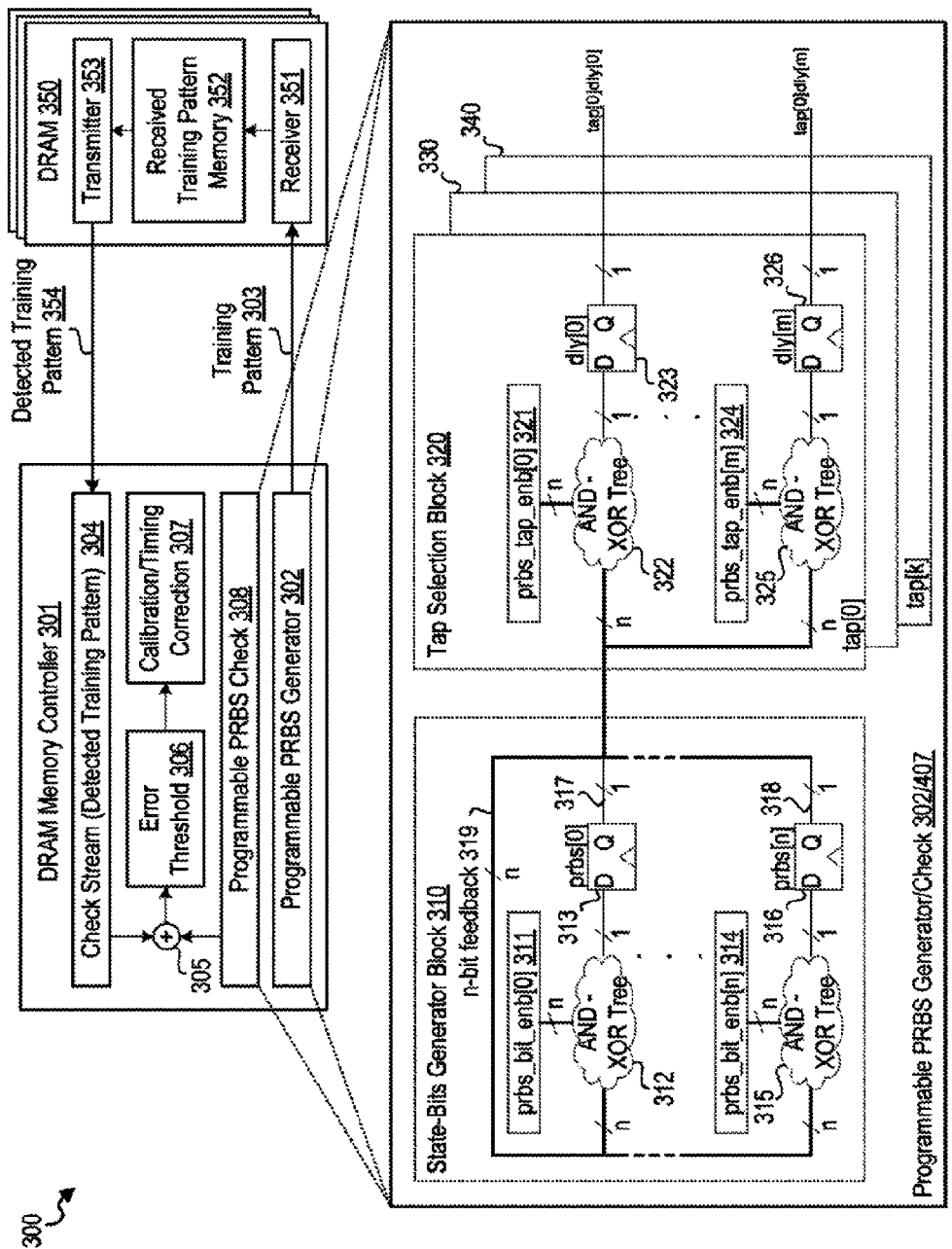
FIG. 3 shows in simplified block diagram form an example memory system with a pseudo random bit stream generator having programmable polynomial, tap, and delay parameters in accordance with selected embodiments of the present disclosure.

As described hereinabove, conventional systems use fixed PRBS generators to control high-speed memory access functions such as clock phase recovery, channel equalization, DRAM training, error detection, etc. However, a programmable PRBS generator having programmable polynomial, tap, and delay parameters is disclosed and described herein which dynamically generates one or more training patterns for use in memory access and control functionality. An example programmable PRBS generator having full programmability of the pseudo random polynomial, full programmability of tap selection, and full programmability of parallel sequence generation is shown in FIG. 3 in simplified block diagram form. As depicted, the programmable PRBS generator 302 is used in a DRAM memory system 300 to generate and transmit training patterns 303 from a DRAM memory controller 301 to a DRAM 350. The disclosed PRBS generator 302 includes a programmable state-bits generator circuit block 310 and a plurality of programmable tap selection circuit blocks 320, 330, 340. The generator block 310 includes a control status register (CSR) for each PRBS state-bit which inputs n control bits to a logic tree to effectively mask the PRBS current state-bits that will be used to determine the PRBS next state-bits. Thus, a first CSR 311 (named prbs_bit_enb[0]) provides n control bits to a first logic tree 312 (e.g., AND/XOR tree) for generating a first next state-bit at its output, a second CSR (named prbs_bit_enb[1]) (not shown) provides n control bits to a second logic tree (not shown) for generating a second next state-bit at its output, and so on until the nth CSR 314 (named prbs_bit_enb[n]) provides n control bits to the nth logic tree 315 which generates the nth next state-bit at its output. The next state-bits from the AND/XOR trees 312, 315 are captured by a corresponding flip-flop or latch circuit 313, 316 (e.g., D flip-flops), and at the next clock cycle, the next state-bits are output from the generator circuit block 310 as n current state bits 317, 318, and are also fed back 319 as inputs to the AND/XOR trees 312, 315. In this respect, the flip-flop or latch circuits 313, 316 correspond in function to the shift registers X1, X23 shown in FIG. 2, and the AND/XOR trees 312, 315 generalize a logical feedback function similar to the block 221 shown in FIG. 2.

With this arrangement, the n control bits programmed into CSRs prbs_bit_enb[1-n] can be thought of as selecting the coefficients for the next state polynomial determined by the AND-XOR trees. A control bit with value "0" would exclude a next state bit from the polynomial term, while a control bit with value "1" would include the next state bit in the polynomial term. With the CSRs, the coefficients may be programmed or pre-computed by software based on the desired polynomial and how much the generator is expected to advance each clock cycle. In this way, the state-bits generator circuit block 310 provides programmability of the polynomial and sequence advance rate. This mechanism supports a programmable sequence advance rate which increases flexibility since the PRBS logic can run at clock speeds slower than bit rate and it can do this dynamically rather than be locked to a specific rate determined at silicon fabrication time.

The programmability of the tap selection circuit blocks 320, 330, 340 is handled in a similar fashion. As shown in FIG. 3, the tap selection and delay values in each of the tap selection circuit blocks 320, 330, 340 are programmed in control status registers (CSRs). For each per tap delay, a corresponding CSR inputs n control bits to a logic tree to effectively mask the PRBS state-bits used in the selected taps. Thus, a first CSR 321 (named prbs_tap_enb[0]) provides n control bits to a first logic tree 322 (e.g., AND/XOR tree) for generating a first next state-bit, a second CSR (named prbs_tap_enb[1]) (not shown) provides n control bits to a second logic tree (not shown) for generating a second next state-bit, and so on until the mth CSR 324 (named prbs_tap_enb[m]) provides n control bits to the mth logic tree 325 which generates the mth next state-bit. The next state-bits from the AND/XOR trees 322, 325 in the first tap selection block 320 (or tap[0]) are captured by a corresponding flip-flop or latch circuit 323, 326 (e.g., D flip-flops), and at the next clock cycle, the next state-bits are output from the first tap selection block 320 as m state bits (tap[0]dly[0] through tap[0]dly[m]). In similar fashion, per tap delay CSRs in the other tap selection circuit blocks 330, 340 are programmed to mask the PRBS state buts used in the selected taps. By logically combining the various PRBS state bits together with the AND/XOR trees 322, 325, a delayed version of the base PRBS sequence is generated. In this respect, the flip-flop or latch circuits 323, 326 correspond in function to the shift registers shown in FIG. 2, and the AND/XOR trees 322, 325 provide a generalized output function similar to the fixed function XOR gate 223 shown in FIG. 2.

With this arrangement, the per tap per delay CSRs prbs_tap_enb[1-n] in each of the tap selection circuit blocks 320, 330, 340 are programmed to mask the PRBS state bits from the state-bits generator circuit block 310 which are provided to the selected taps. The values loaded in the CSRs are pre-computed based on the desired polynomial, desired PRBS taps (sequence delay) and needed delayed sequence values.

In applications where there are a plurality of wires or lanes (e.g., 64 wires) to a DRAM 350 which each must receive a training pattern, selected embodiments of the PRBS generator 302 may effectively replace a plurality of conventional PRBS generators (e.g., 64 LFSR training pattern generators) which would otherwise be required to generate PRBS values at great processing and circuit area cost. This efficiency is afforded by including a plurality of tap selection circuit blocks 320, 330, 340 in the PRBS generator 302. At each of the tap selection circuit blocks 320, 330, 340, the CSRs (prbs_tap_enb[i]) are programmed to generate the base pseudo random bit stream sequence shifted in time, thereby generating minimally correlated random outputs that may be separately applied to the plurality of wires or lanes.

Once the training sequence 303 is generated and transmitted to the DRAM 350, a calibration procedure may be performed at the DRAM 350 to identify a "data eye" when sampling decisions can be made during write operations. However, due to limited processing power at the DRAM 350, the received training pattern data may also be stored and returned to the memory controller 301 for processing. To this end, a receiver 351 at the DRAM 350 may be provided to detect and store the received training pattern in memory 352. Subsequently, a transmitter 353 at the DRAM 350 sends the detected training pattern data 354 to the DRAM controller 301 where it is processed for comparison with the originally transmitted training pattern data 303.

To compare of the detected training pattern data 354 with the originally transmitted training pattern data 303, the programmable PRBS generator 302 can regenerate the original training pattern data or can store the original training pattern data in memory at the memory controller 301. Alternatively, a separate programmable PRBS check generator 308 may also be provided at the memory controller 301 and programmed to replicate the originally transmitted training pattern data 303. From a hardware standpoint, the programmable PRBS check generator 308 may be a duplicate of the programmable PRBS generator 302 and programmed identically to generate the same training pattern data. However generated, the originally transmitted training pattern data is compared to the detected training pattern 354 as it is received as check stream data 304 using any desired comparison circuit 305, such as a modulo-two adder, also known as an exclusive OR (XOR) gate. The comparison output may be processed with error threshold module 306 to determine if an error threshold is exceeded, in which case a calibration or timing correction module 307 uses the comparison results to identify a "data eye" for write operation sampling decisions.

Since calibration and training procedures can be a multistage process that uses different training data rates, active training time spans and active lanes during the various stages, the programmable PRBS generator/check hardware 302/307 advantageously provides flexibility in the random pattern periodicity that assists with training the optimal data eye position. In addition, the programmable PRBS generator/check hardware 302/307 advantageously supports different clock ratios between the internal parallel bus clock rate and external serial bit rate clocks. With the programmable PRBS generator hardware 302/307, the hardware can be partitioned to generate simultaneous sub-polynomial generators within the main generator and these sequences can be steered to the specific outputs through the tap selection blocks. This is especially useful when training certain DRAM parameters that have special lane mappings such as G5 address training that maps DDR address bits to DQ bits.

As seen in FIG. 3, the structural uniformity of the CSR and latch/flip-flop hardware configuration in the state-bits generator circuit block and tap selection circuit blocks make it easy to parameterize the size of the RTL code. This secondary benefit supports fast and flexible testing environments. As will be appreciated, for fast simulation and formal analysis response times, the RTL code may be parameterized for small block and polynomial sizes during verification. In addition, it will be appreciated that the apparent hardware costs in terms of additional size for the programmable PRBS generator are not as significant as it may first appear since the solution eliminates the need for multiple generators. In addition, the CSRs in the tap selection circuit blocks (prbs_tap_enb) can be configured to be used as deterministic pattern generators (rotating shift registers) that are also needed for typical training applications.

Figure 4:
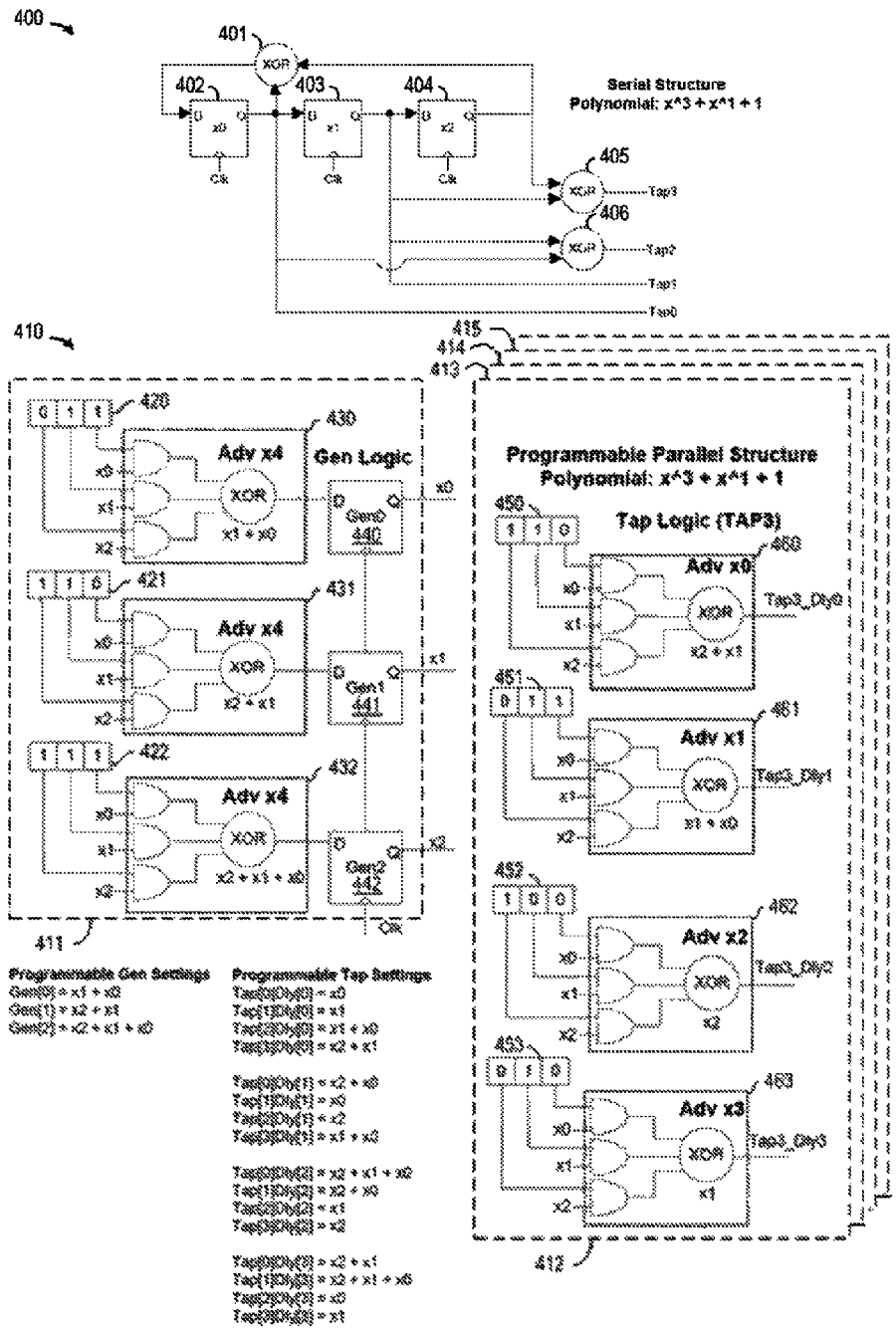
FIG. 4 illustrates an example programming sequence to show how control status registers may be used to program the generation of the pseudo random bit sequence from a programmable pseudo random bit stream generator.

To illustrate how the CSRs may be used to program the generation of the pseudo random bit sequence from a programmable PRBS generator, reference is now made to FIG. 4 which illustrates an example linear feedback shift register (LFSR) 400 for generating a characteristic polynomial $x^3+x^1+1$, along with a PRBS generator 410 which is programmed to generate the same characteristic polynomial $x^3+x^1+1$. In the depicted example, the LFSR 400 has a serial structure which includes three D-flip flops 402, 403, 404 connected in series, with feedback taps at the outputs of the 1st and 3rd D-flip flops 402, 404. In addition, the output of the 1st D-flip flop 402 is provided as the first output tap (Tap0), the output of the 2nd D-flip flop 403 is provided as the second output tap (Tap1), the outputs of the 1st and 2nd D-flip flops 402, 403 are provided to the XOR gate 406 to generate the third output tap (Tap2), and the output of the 2nd and 3rd D-flip flops 403, 404 are provided to the XOR gate 405 to generate the fourth output tap (Tap3). With this configuration, the D-flip flops 402, 403, 404 are initialized with initial values x0, x1, x2, respectively, so that initially (time=0), the output tap values are Tap0=x0, Tap1=x1, Tap2=x1+x0, and Tap3=x2+x1 as the data values shift through the LFSR 400. At the next clock (time=1), the output tap values are Tap0=x2+x0, Tap1=x0, Tap2=x2, and Tap3=x2+x0, and at the next clock (time=2), the output tap values are Tap0=x2+x1+x0, Tap1=x2+x0, Tap2=x1, and Tap3=x2 as the data values shift through the LFSR 400. Finally, at the fourth clock (time=3), the output tap values are Tap0=x2+x1, Tap1=x2+x1+x0, Tap2=x0, and Tap3=x1 as the data values shift through the LFSR 400. As seen from this example, the sequence of values produced by the LFSR 400 is completely determined by its current (or previous) state and the LFSR characteristic polynomial. However, when constructed with a fixed serial circuit structure of flip-flops and output XOR gates, the LFSR 400 has limited flexibility in terms of the PRBS that can be generated for any given application, and the resulting PRBS is confined to the specified characteristic polynomial $x^3+x^1+1$.

To provide a more flexible approach for generating pseudo random bit stream sequences, there is disclosed a programmable PRBS generator 410 having a programmable state-bits generator circuit 411 and k programmable tap selection circuits 412-415. In both the programmable state-bits generator circuit 411 and k programmable tap selection circuits 412-415, control status registers are provided which can be programmed to specify any desired polynomial characteristic for the base pseudo random bit stream sequence. In particular, the programmable state-bits generator block 411 generates n=3 PRBS current state-bits x0, x1, x2 using n state-bit control status registers 420-422 to mask n programmable generator logic blocks 430-432 having n corresponding latches 440-442 connected, respectively, to outputs of the n programmable generator logic blocks 430-432 so that the generator logic blocks 430-432 each process the n PRBS current state-bits x0, x1, x2 to output a single next state-bit to one of the n corresponding latches 440-442. As depicted, the generator logic blocks 430-432 and latches 440-442 are deployed in a feedback configuration to output and feedback the n PRBS current state-bits x0, x1, x2 as inputs to the generator logic blocks 430-432. In this respect, the latches 440-442 correspond in function to the D-flip flops 402-404 in LFSR 400, and the generator logic blocks 430-432 provide an expanded logical feedback function similar to the XOR gate 401 in LFSR 400. In addition, each of the k programmable tap selection circuits (e.g., the selection circuit 412 for tap 3) is connected to receive the n=3 PRBS current state-bits x0, x1, x2 which are masked with m=4 tap selection control status registers 450-453 as inputs to m corresponding tap logic blocks 460-463. With this configuration, the m tap logic blocks 460-463 each process the n PRBS current state-bits x0, x1, x2 to output a single next state tap bit (Tap3_Dly0, Tap3_Dly1, Tap3_Dly2, Tap3_Dly3) from the programmable tap selection circuit (e.g., 412). Once the control status registers 420-422, 450-454 are programmed and output latches at the outputs of the logic blocks 430-432, 460-463 are initialized with start values, a clock generator circuit generates a clock signal (Clk) which clocks the output latches to capture outputs from the logic blocks 430-432, 460-464 so that outputs from the tap logic blocks 460-463 are output as a pseudo random bit stream sequence. In FIG. 4, the output latches 440-442 are shown for the logic blocks 430-432, but the output latches for the logic blocks 460-463 are not shown.

To illustrate how the PRBS generator 410 can be programmed to obtain four consecutive PRBS sequence bits per clock with a specific pattern delay offset from the base sequence, an example programming sequence is now described wherein the following values are calculated in software and programmed into the control status registers 420-422 of the generator circuit for selected polynomial: $x^3 + x^1 + 1$ (advance by 4):

Gen settings: prbs_bit_enb[0]=3=011 (binary)
Gen settings: prbs_bit_enb[1]=6=110 (binary)
Gen settings: prbs_bit_enb[2]=7=111 (binary)

In addition, software calculates the following values for the per tap delay control status registers in the k=4 tap selection blocks:

| | |
|---|---|
| Tap settings: prbs_tap_enb[0]Dly[0] = 1 | Tap settings: prbs_tap_enb[1]Dly[0] = 2 |
| Tap settings: prbs_tap_enb[0]Dly[1] = 5 | Tap settings: prbs_tap_enb[1]Dly[1] = 1 |
| Tap settings: prbs_tap_enb[0]Dly[2] = 7 | Tap settings: prbs_tap_enb[1]Dly[2] = 5 |
| Tap settings: prbs_tap_enb[0]Dly[3] = 6 | Tap settings: prbs_tap_enb[1]Dly[3] = 7 |
| Tap settings: prbs_tap_enb[2]Dly[0] = 3 | Tap settings: prbs_tap_enb[3]Dly[0] = 6 |
| Tap settings: prbs_tap_enb[2]Dly[1] = 4 | Tap settings: prbs_tap_enb[3]Dly[1] = 3 |
| Tap settings: prbs_tap_enb[2]Dly[2] = 2 | Tap settings: prbs_tap_enb[3]Dly[2] = 4 |
| Tap settings: prbs_tap_enb[2]Dly[3] = 1 | Tap settings: prbs_tap_enb[3]Dly[3] = 2 |

In FIG. 4, only the programmed values are shown for the per tap delay control status registers (e.g., prbs_tap_enb[3] Dly[0:3]) in the tap 3 selection circuit 412. In particular, the first CSR 450 is programmed to provide n control bits (110) (or 6 decimal shown in table) to a first tap logic block 460 for generating a first single next state tap bit (Tap3_Dly0), a second CSR 451 is programmed to provide n control bits (011) (or 3 decimal) to a second tap logic block 461 for generating a second single next state tap bit (Tap3_Dly1), a third CSR 452 is programmed to provide n control bits (100) (or 4 decimal) to a third tap logic block 462 for generating a third single next state tap bit (Tap3_Dly2), and a fourth CSR 453 is programmed to provide n control bits (010) (or 2 decimal) to a fourth tap logic block 463 for generating a fourth single next state tap bit (Tap3_Dly4).

As this example demonstrates, the PRBS generator 410 supports full programmability of the pseudo random polynomial by providing control bit CSRs (e.g., 420-422) for programming any polynomial up to the supported width n of the CSRs in the state-bits generator block 411. The PRBS generator 410 also supports full programmability of tap selection by providing per tap delay CSRs (e.g., 450-453) for programming any combination of generator state taps. In addition, the PRBS generator 410 supports full programmability of parallel sequence generation to determine the number of sequential bits calculated and how much the sequence generator advances per clock. In addition, it will be appreciated that the example n bit programmable PRBS generator 410 can be partitioned into smaller independent sub-generators dividing the n PRBS current state-bits into a plurality of PRBS current state-bit subgroups (e.g., a first subgroup of i current state-bits, a second subgroup of j current state-bits, and a third subgroup of k current state-bits, where $i+j+k \leq n$). In this way, the first subset of i PRBS current state-bits may be applied to a first set of i programmable tap selection circuits, the second subset of j PRBS current state-bits may be applied to a second set of j programmable tap selection circuits, and the third subset of k PRBS current state-bits may be applied to a third set of k programmable tap selection circuits.

Figure 5:
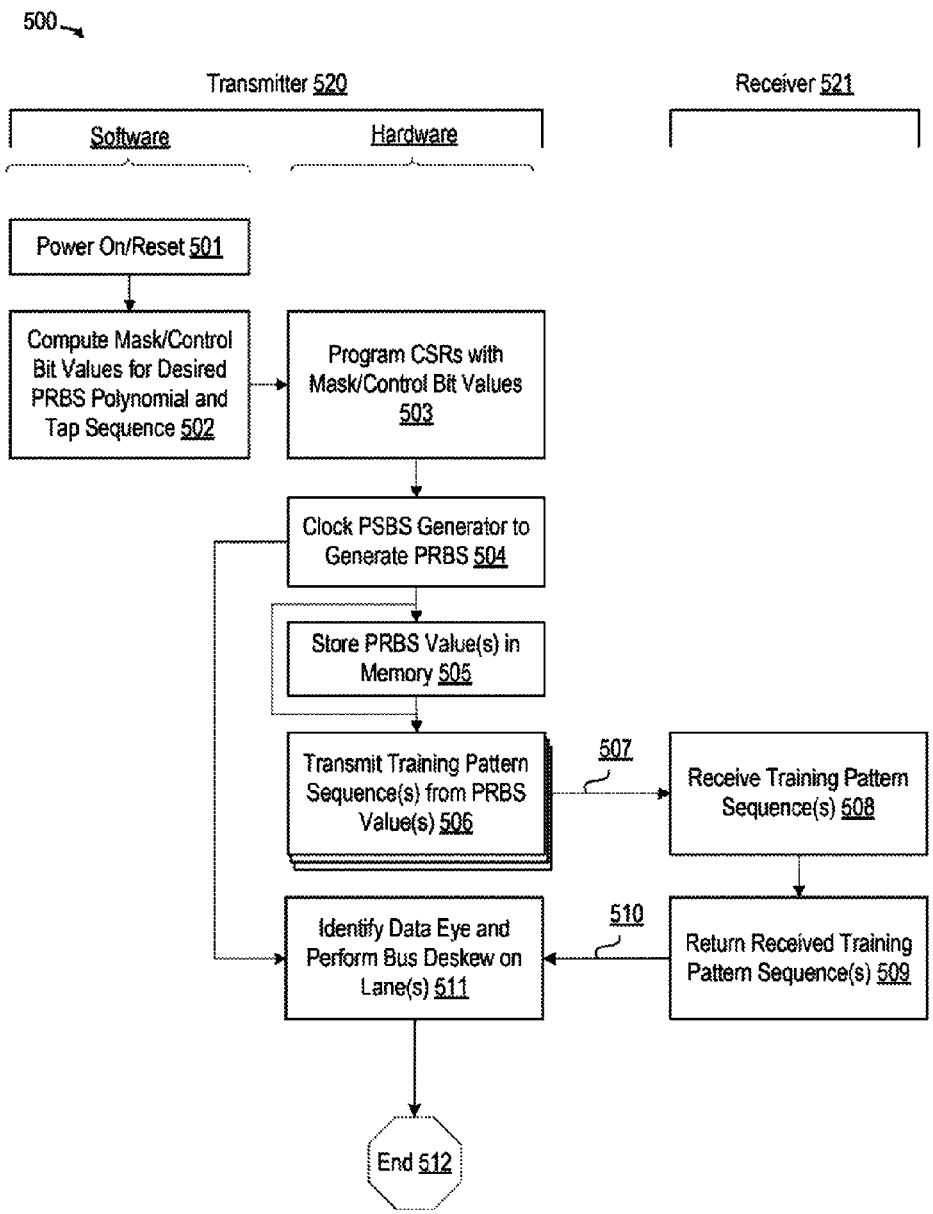
FIG. 5 illustrates a flow diagram of a method for using a programmable pseudo random bit stream generator in a data eye training application in accordance with selected embodiments of the present disclosure.

In general, selected embodiments of the programmable pseudo random pattern generator hardware and method of operation disclosed herein provide a flexible method for generating pseudo random patterns with simple uniform hardware structure, allowing the creation of specific PRBS polynomials and tap selection to be controlled by software. The programming flexibility enables post silicon training algorithm changes that are needed to work around late-breaking pattern-related training issues. For example, reference is now made to FIG. 5 which illustrates an example process 500 for using a programmable pseudo random bit stream generator in accordance with selected embodiments of the present disclosure. Without loss of generality, the process 500 is described with reference to an example method performed at a transmitter 520 (e.g., DRAM memory controller) and receiver 521 (e.g., DRAM) with a combination of software and hardware steps for using a programmable PRBS generator in a data eye training application. As disclosed, the process 500 is initiated at the transmitter 520 in step 501 after a reset or power-on condition is detected in software (e.g., at startup).

At step 502, the CSR control bits or coefficients for the "per PRBS state bit" CSRs (prbs_bit_enb[ ]) and "per tap per delay" CSRs (prbs_tap_enb[ ]) are computed in software. The computed coefficients may be pre-computed based on the desired polynomial and how much the generator is expected to advance each clock cycle. The computed CSR control bits or coefficients will effectively select the coefficients for the next state polynomial determined by the AND-XOR tree.

At step 503, the hardware CSR registers in the PRBS generator are programmed with the computed CSR control bit or coefficient values. The programmed CSRs function as a mask to selectively enable the individual AND/XOR logic trees, thereby determining which PRBS current state-bits will be used to determine the PRBS next state-bits and which PRBS state bits will be used at the selected taps when outputting the PRBS values.

At step 504, the PRBS generator is clocked to generate a pseudo random bit stream based on the programmed CSR control bit or coefficient values. The generated PRBS values may be stored in memory (step 505) or directly transmitted to the receiver (step 506) as one or more training pattern sequences 507. By storing the PRBS values in memory, the PRBS generator is able to operate at a lower clock rate than faster circuits having a higher clock rate by pre-computing and retrieving the stored PRBS values for use by the faster circuits.

At the receiver 521, the training pattern sequence(s) 507 are received (step 508) and may also be stored in memory as the received training pattern sequence(s). Rather than processing the received training pattern sequence(s) at the receiver 521, they may be returned to the transmitter 520 (step 509) as retrieved training pattern sequence(s) 510.

At step 511, the retrieved training pattern sequence(s) 510 are used to identify the data eye or otherwise perform bus deskew on the DRAM memory lanes. As will be appreciated, any desired processing techniques may be applied to the retrieved training pattern sequence(s) 510, and not just data eye training or bus deskew operations. At step 512, the process ends.

By now it will be appreciated that there is disclosed herein a method and circuit for generating one or more pseudo random bit streams. In the disclosed PRBS generator and methodology, a programmable state-bits generator circuit is provided which generates n PRBS current state-bits using n state-bit control status registers, n corresponding PRBS logic trees, and n latches (e.g., flip-flop storage devices) connected to the outputs of the n corresponding PRBS logic trees deployed in a feedback configuration where the n state-bit control status registers mask the corresponding one or more PRBS logic trees which each process n PRBS current state-bits to generate a single next state-bit. In addition, one or more programmable tap selection circuits are connected to receive the n PRBS current state-bits, each programmable tap selection circuit having m tap selection control status registers which mask m corresponding PRBS logic trees having m latches connected to the outputs thereof to process n PRBS state-bits to generate a single next state tap bit. In selected embodiments, the programmable tap selection circuit is constructed with a plurality of programmable tap selection circuits, each connected to receive a subset of the n PRBS current state-bits, thereby forming multiple independent sub-generators. In addition, the tap selection control bits may be stored opportunistically in a deterministic pattern generator circuit typically deployed for transmitting walking-one and checkerboard training patterns. As will be appreciated, these functions are not used simultaneously, but may instead be alternately applied to overload the hardware, thereby reducing the hardware footprint. A clock generator circuit clocks the latches to capture outputs from the PRBS logic trees in the programmable state bits generator circuit and tap selection circuit, where outputs from the PRBS logic trees in the programmable state bits generator circuit are provided to the tap selection circuit and fed back as inputs to the PRBS logic trees in the programmable state bits generator circuit, and where outputs from the PRBS logic trees in the tap selection circuit are output as a pseudo random bit stream sequence. With this configuration, the n state-bit control status registers may be computed in software and loaded as control bits to programmatically control a characteristic polynomial of the programmable state bits generator circuit, to specify a characteristic polynomial for the pseudo random bit stream sequence, to specify a logical combination of the n state-bit control status registers, and/or to specify how far the pseudo random bit stream sequence advances each clock cycle. In selected embodiments, the programmable tap selection circuits include a plurality of k programmable tap selection circuits, where k equals a number of data bits to a DRAM memory and where each k programmable output circuit comprises m programmable tap selection blocks. Each of the k programmable tap selection circuits is connected to receive the n PRBS current state-bits and comprising a plurality of tap selection control status registers, a plurality of corresponding PRBS logic trees, and a plurality of corresponding latches connected, respectively, to outputs of the plurality of corresponding PRBS logic trees such that the plurality of tap selection control status registers is connected to mask one of the plurality of corresponding PRBS logic trees which each process the n PRBS current state-bits to output a single next state tap bit. In other embodiments, a plurality of programmable state-bits generator circuits may be provided, each for generating n PRBS current state-bits under control of n state-bit control status registers. In this case, a partition circuit may be provided for partitioning a multi-bit control word into first and second n-bit control words, where the first n-bit control word is stored in the n state-bit control status registers of a first programmable state-bits generator circuit, and where the second n-bit control word is stored in the n state-bit control status registers of a second programmable state-bits generator circuit.

In other embodiments, there is disclosed a method, apparatus and system for training a dynamic random access memory (DRAM). In the disclosed methodology, control status register control bits are computed which include state control bits and per tap per delay control bits. The control status register control bits are used to program hardware control state registers in a programmable pseudo random bit stream (PRBS) generator by storing a plurality of state control bits in a corresponding first plurality of state-bit control status registers in a programmable state-bits generator circuit and storing a plurality of per tap per delay control bits in a corresponding second plurality of tap selection control status registers in a plurality of programmable tap selection circuits. As described herein, the programmable PRBS generator supports full programmability of a pseudo random polynomial, full programmability of tap selection, and full programmability of parallel sequence generation, and includes a programmable state-bits generator circuit block with n state-bit control status registers as control inputs to mask n PRBS logic trees which generate PRBS next state-bits from the PRBS current state-bits, and a programmable tap selection circuit block having a k tap selection circuits which each include m per tap, per delay control status registers as control inputs to mask the PRBS state-bits applied to the m logic trees which respectively feed m delay circuits. Once programmed, the programmable state-bits generator circuit and the plurality of programmable tap selection circuits are clocked to generate a pseudo random bit stream based on the programmed plurality of control status register control bits. The resulting pseudo random bit stream is written as a training pattern sequence to a memory address over a memory lane for storage in a DRAM as a received training pattern sequence. Subsequently, the received training pattern sequence is compared to the pseudo random bit stream to identify a data eye on the memory lane. The comparison may be performed by retrieving the received training pattern sequence from the DRAM to a memory controller. In addition, the memory controller regenerates the pseudo random bit stream by programming and clocking a second PRBS generator (or the original PRBS generator) with the plurality of control status register control bits to regenerate the pseudo random bit stream for comparison with the received training pattern sequence to identify a data eye on the memory lane. In addition, the pseudo random bit stream may be stored in a plurality of output latches at the plurality of programmable tap selection circuits for subsequent playback at a higher clock rate than used for clocking the programmable state-bits generator circuit and the plurality of programmable tap selection circuits when writing the pseudo random bit stream as a training pattern sequence. In selected embodiments, the plurality of control status register control bits are computed in software for CSRs in the programmable state-bits generator circuit to specify how far the pseudo random bit stream advances each clock cycle. In addition or in the alternative, the plurality of control status register control bits are computed in software for CSRs in the plurality of programmable tap selection circuits to specify a starting sequence time-shift with respect to the base pseudo random bit stream sequence. In other embodiments, the hardware control state registers are programmed by storing a first plurality of per tap per delay control bits in tap selection control status registers for a first programmable tap selection circuit and storing a second plurality of per tap per delay control bits in tap selection control status registers for a second programmable tap selection circuit, thereby steering different pseudo random bit stream sequences to different lanes from the first and second programmable tap selection circuits. As a result, of using programmable control status registers and multiple tap selection circuits, the training method may be performed as a post silicon training algorithm to work around late breaking pattern-related training issues.

Although the described exemplary embodiments disclosed herein are directed to selected PRBS generator embodiments and methods for using same in DRAM training applications, the present invention is not necessarily limited to the example embodiments which illustrate inventive aspects of the present invention that are applicable to a wide variety of memory types, processes and/or designs. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

Accordingly, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A method for generating a pseudo random bit stream, comprising:
programming control bits into a plurality of control status registers comprising one or more PRBS state bit control status registers and one or more per tap state bit control status registers, where each PRBS state bit control status register masks a combinatorial logic element in a state bits generator hardware circuit, and where each per tap state bit control status register masks a combinatorial logic element in a tap selection hardware circuit; and
clocking a plurality of output latches to capture outputs from the combinatorial logic elements in the state bits generator circuit and the tap selection hardware circuit, where outputs from output latches in the state bits generator circuit are provided to the tap selection hardware circuit and fed back as inputs to the combinatorial logic elements in the state bits generator circuit, and where outputs from output latches in the tap selection hardware circuit are output as a pseudo random bit stream sequence.

2. The method of claim 1, where programming control bits comprises loading n control bits into a plurality of n PRBS state bit control status registers in the state bits generator hardware circuit, where each of the plurality of n PRBS state bit control status registers masks an AND-XOR logic tree in the state bits generator hardware circuit to programmatically control a characteristic polynomial of the state bits generator hardware circuit.

3. The method of claim 2, where clocking the plurality of latches comprises clocking a plurality of n flip-flops, each of which is connected to an AND-XOR logic tree in the state bits generator hardware circuit.

4. The method of claim 1, where programming control bits comprises loading n control bits into a plurality of m per tap state bit control status registers in the tap selection hardware circuit, where each of the plurality of m per tap state bit control status registers masks an AND-XOR logic tree in the tap selection hardware circuit to programmatically control tap selection and sequence delay values of the tap selection hardware circuit.

5. The method of claim 4, where clocking the plurality of latches comprises clocking a plurality of m flip-flops, each of which is connected to an AND-XOR logic tree in the tap selection hardware circuit.

6. The method of claim 1, further comprising computing the control bits for the plurality of control status registers in software to specify a characteristic polynomial for the pseudo random bit stream sequence.

7. The method of claim 1, further comprising computing the control bits for the plurality of control status registers in software to specify which outputs from output latches will be applied as inputs to the combinatorial logic elements in the state bits generator hardware circuit.

8. The method of claim 1, further comprising computing the control bits for the plurality of control status registers in software to specify how far the pseudo random bit stream sequence advances each clock cycle.

9. The method of claim 1, further comprising performing a training procedure to initialize a link between a memory controller and a memory device by transmitting the pseudo random bit stream sequence data over the link from the memory controller to the memory device where it is received as a training pattern sequence; comparing the training pattern sequence with an expected result to identify data eye positioning for the link.

10. A pseudo random bit stream (PRBS) generator, comprising:
a programmable state-bits generator circuit comprising:

a programmable state-bits generator circuit for generating n PRBS current state-bits, comprising n state-bit control status registers, n corresponding PRBS logic trees, and n corresponding latches connected, respectively, to outputs of the n corresponding PRBS logic trees deployed in a feedback configuration to output and feedback the n PRBS current state-bits as inputs to the n corresponding PRBS logic trees, where each of the n state-bit control status registers is connected to mask one of the n corresponding PRBS logic trees which each process the n PRBS current state-bits to output a single next state-bit to one of the n corresponding latches;

a programmable tap selection circuit connected to receive the n PRBS current state-bits, the programmable tap selection circuit comprising m tap selection control status registers, m corresponding PRBS logic trees, and m corresponding latches connected, respectively, to outputs of the m corresponding PRBS logic trees, where each of the m tap selection control status registers is connected to mask one of the m corresponding PRBS logic trees which each process the n PRBS current state-bits to output a single next state tap bit to one of the m corresponding latches; and a clock generator circuit for clocking the n corresponding latches and the m corresponding latches to capture outputs from the PRBS logic trees in the programmable state-bits generator circuit and programmable tap selection circuit so that outputs from the m corresponding latches in the programmable tap selection circuit are output as a pseudo random bit stream sequence.

11. The PRBS generator of claim 10, where the n corresponding latches in the programmable state-bits generator circuit and the m corresponding latches in the programmable tap selection circuit each comprise a flip-flop storage device.

12. The PRBS generator of claim 10, where the n state-bit control status registers may be programmed by loading control bits to programmatically control a characteristic polynomial of the programmable state bits generator circuit.

13. The PRBS generator of claim 12, where the control bits for the n state-bit control status registers in the programmable state-bits generator circuit are computed in software to specify a characteristic polynomial for the pseudo random bit stream sequence.

14. The PRBS generator of claim 12, where the control bits for the n state-bit control status registers in the programmable state-bits generator circuit are computed in software to specify how far the pseudo random bit stream sequence advances each clock cycle.

15. The PRBS generator of claim 10, where the programmable tap selection circuit comprises a plurality of k programmable output circuits, where each k programmable output circuit comprises m programmable tap selection blocks, each connected to receive the n PRBS current state-bits and comprising a plurality of tap selection control status registers, a plurality of corresponding PRBS logic trees, and a plurality of corresponding latches connected, respectively, to outputs of the plurality of corresponding PRBS logic trees such that the plurality of tap selection control status registers is connected to mask one of the plurality of corresponding PRBS logic trees which each process the n PRBS current state-bits to output a single next state tap bit.

16. The PRBS generator of claim 15, where k equals a number of data bits to a DRAM memory.

17. The PRBS generator of claim 10, where the programmable state-bits generator circuit comprises a plurality of programmable state-bits generator circuits, each for generating n PRBS current state-bits under control of n state-bit control status registers.

18. The PRBS generator of claim 17, further comprising a partition circuit for partitioning a multi-bit control word into first and second n-bit control words, where the first n-bit control word is stored in the n state-bit control status registers of a first programmable state-bits generator circuit, and where the second n-bit control word is stored in the n state-bit control status registers of a second programmable state-bits generator circuit.

19. The PRBS generator of claim 10, where the programmable tap selection circuit comprises a plurality of programmable tap selection circuits, each connected to receive a subset of the n PRBS current state-bits, thereby forming multiple independent sub-generators.

20. The PRBS generator of claim 10 where the tap selection control bits are stored opportunistically in a deterministic pattern generator circuit deployed for transmitting walking-one and checkerboard training patterns.

21. A method of training a dynamic random access memory (DRAM), comprising:
   computing a plurality of control status register control bits comprising a plurality of state control bits and a plurality of per tap per delay control bits;
   programming a plurality of hardware control state registers in a programmable pseudo random bit stream (PRBS) generator with the plurality of control status register control bits by storing the plurality of state control bits in a corresponding first plurality of state-bit control status registers in a programmable state-bits generator circuit and storing the plurality of per tap per delay control bits in a corresponding second plurality of tap selection control status registers in a plurality of programmable tap selection circuits;
   clocking the programmable state-bits generator circuit and the plurality of programmable tap selection circuits to generate a pseudo random bit stream based on the programmed plurality of control status register control bits;
   writing the pseudo random bit stream as a training pattern sequence to a memory address over a memory lane for storage in a DRAM as a received training pattern sequence; and
   comparing the received training pattern sequence to the pseudo random bit stream to identify a data eye on the memory lane.

22. The method of claim 21, where the programmable PRBS generator supports full programmability of a pseudo random polynomial, full programmability of tap selection, and full programmability of parallel sequence generation.

23. The method of claim 21, where the programmable PRBS generator comprises:
   a programmable state-bits generator circuit block comprising a plurality of n state-bit control status registers as control inputs to mask a plurality of n PRBS logic trees which generate PRBS next state-bits from the PRBS current state-bits; and
   a programmable tap selection circuit block comprising a plurality of k tap selection circuits which each include a plurality of m per tap, per delay control status registers as control inputs to mask the PRBS state-bits applied to the m logic trees which respectively feed m delay circuits.

24. The method of claim 21, further comprising:
   retrieving the received training pattern sequence from the DRAM;

regenerating the pseudo random bit stream by programming a second PRBS generator with the plurality of control status register control bits; and comparing the received training pattern sequence to the pseudo random bit stream generated by the second programmable PRBS generator to identify a data eye on the memory lane.

25. The method of claim 21, further comprising:

storing the pseudo random bit stream in a plurality of output latches at the plurality of programmable tap selection circuits for subsequent playback at a higher clock rate than used for clocking the programmable state-bits generator circuit and the plurality of programmable tap selection circuits when writing the pseudo random bit stream as a training pattern sequence.

26. The method of claim 21, where computing the plurality of control status register control bits comprises computing state-control bits for a plurality of control status registers in the programmable state-bits generator circuit in software to specify how far the pseudo random bit stream advances each clock cycle.

27. The method of claim 21, where computing the plurality of control status register control bits comprises computing the plurality of per tap per delay control bits for the second plurality of tap selection control status registers in software to specify a starting sequence time-shift with respect to a base pseudo random bit stream sequence.

28. The method of claim 21, where programming the plurality of hardware control state registers comprises storing a first plurality of per tap per delay control bits in tap selection control status registers for a first programmable tap selection circuit and storing a second plurality of per tap per delay control bits in tap selection control status registers for a second programmable tap selection circuit, thereby steering different pseudo random bit stream sequences to different lanes from the first and second programmable tap selection circuits.

29. The method of claim 21, where the method of training is performed as a post silicon training algorithm to work around late breaking pattern-related training issues.

* * * * *